United States Patent
Tokunaga et al.

(10) Patent No.: US 8,384,101 B2
(45) Date of Patent: Feb. 26, 2013

(54) SEMICONDUCTOR LIGHT-EMITTING DEVICE

(75) Inventors: Seiichi Tokunaga, Suita (JP); Kunio Takeuchi, Joyo (JP)

(73) Assignee: Sanyo Electric Co., Ltd., Osaka (JP)

( * ) Notice: Subject to any disclaimer, the term of this patent is extended or adjusted under 35 U.S.C. 154(b) by 418 days.

(21) Appl. No.: 12/441,247

(22) PCT Filed: Jan. 14, 2008

(86) PCT No.: PCT/JP2008/050306
§ 371 (c)(1),
(2), (4) Date: Mar. 13, 2009

(87) PCT Pub. No.: WO2008/087918
PCT Pub. Date: Jul. 24, 2008

(65) Prior Publication Data
US 2010/0044731 A1 Feb. 25, 2010

(30) Foreign Application Priority Data

Jan. 15, 2007 (JP) .................. 2007-005323
Jan. 11, 2008 (JP) .................. 2008-004024

(51) Int. Cl.
*H01L 33/00* (2010.01)
(52) U.S. Cl. .................. 257/98; 257/E33.001
(58) Field of Classification Search ............. 257/98, 257/E33.001
See application file for complete search history.

(56) References Cited

U.S. PATENT DOCUMENTS

| | | | |
|---|---|---|---|
| 4,648,691 A * | 3/1987 | Oguchi et al. | 349/162 |
| 6,576,931 B2 | 6/2003 | Furukawa et al. | |
| 6,936,852 B2 | 8/2005 | Furukawa et al. | |
| 7,066,626 B2 * | 6/2006 | Omata | 362/257 |
| 7,388,232 B2 * | 6/2008 | Suehiro et al. | 257/98 |
| 2005/0189539 A1 | 9/2005 | Furukawa et al. | |
| 2005/0194609 A1 | 9/2005 | Furukawa et al. | |
| 2008/0191620 A1 * | 8/2008 | Moriyama et al. | 313/506 |

FOREIGN PATENT DOCUMENTS

| | | |
|---|---|---|
| JP | 2002050797 A | 2/2002 |
| JP | 2003086849 A | 3/2003 |
| JP | 2005191219 A | 7/2005 |
| JP | 2005332951 A | 12/2005 |
| JP | 2006032726 A | 2/2006 |
| JP | 2006190710 A | 7/2006 |
| JP | 2007-234779 | 9/2007 |

OTHER PUBLICATIONS

International Search Report for PCT/JP2008/050306, 7 pp, Japan.
International Search Report for corresponding Application No. PCT/JP2008/050306, Feb. 12, 2008, pp. 1-4.
Notification of Reason(s) for Rejection with English Translation, Japanese Patent Application No. 2008-176622, dated May 22, 2012.

* cited by examiner

*Primary Examiner* — Calvin Lee
*Assistant Examiner* — Monica D Harrison
(74) *Attorney, Agent, or Firm* — Ditthavong Mori & Steiner, P.C.

(57) ABSTRACT

Such a semiconductor light-emitting device (10, 30, 40) that emitted light has small directivity of light intensity and a color tone and a light output is hardly reduced is obtained. This semiconductor light-emitting device includes a semiconductor light-emitting element (1, 31) and a thin-film light diffusion portion (8, 8a, 38, 41) arranged on a light-emitting direction side of the semiconductor light-emitting element.

18 Claims, 6 Drawing Sheets

[CONCEPTUAL DIAGRAM WITH FILM THICKNESS OF ABOUT 3 nm]

[CONCEPTUAL DIAGRAM WITH FILM THICKNESS OF ABOUT 6 nm]

[CONCEPTUAL DIAGRAM
WITH FILM THICKNESS OF ABOUT 50 nm TO ABOUT 100 nm]

SEMICONDUCTOR LIGHT-EMITTING DEVICE

TECHNICAL FIELD

The present invention relates to a semiconductor light-emitting device employing a semiconductor light-emitting element.

BACKGROUND ART

In recent years, a semiconductor light-emitting device employing a semiconductor light-emitting element such as a light-emitting diode (LED) has been developed as a light source for illumination. In particular, a white semiconductor light-emitting device implementing white light by wavelength-converting light emitted from an LED by a phosphor or the like is expected as a light-emitting device substituting for a fluorescent lamp.

However, the light emitted from the LED or the like employed in such a semiconductor light-emitting device has strong directivity, and hence the light output may have remarkably varied with the angle of observation. In the aforementioned white semiconductor light-emitting device employing the wavelength conversion technique, there has been such an inconvenience that the color tone changes in response to the strength/weakness of the light output from the LED and hence the color tone varies with the angle of observation.

As a related technique, there is a method of reducing the directivity of light emitted from an LED by arranging a diffusion material around the LED (refer to Japanese Patent Laying-Open No. 2002-50797, for example).

As shown in FIG. 13, an LED 101 of ultraviolet emission is fixed to the bottom surface of a recess portion of a metal frame 102 with solder or the like (not shown) in an LED lamp 100 of the related technique. Thus, one electrode (not shown) of the LED 101 is electrically connected with the frame 102. One end of a first lead 103 is mounted on the frame 102. Another electrode (not shown) of the LED 101 is electrically connected with one end of a second lead 105 through a metal wire 104.

A light diffusion portion 106 covering the LED 101 arranged on the bottom surface side and a phosphor portion 107 arranged on the light diffusion portion 106 are formed in the recess portion of the frame 102. The light diffusion portion 106 is made of silicon resin containing a diffusion agent consisting of alumina particles or the like. The phosphor portion 107 is made of silicon resin containing three types of phosphors (hereinafter abbreviated as RGB phosphors) of an ultraviolet excitation red emission phosphor (R phosphor), an ultraviolet excitation green emission phosphor (G phosphor) and an ultraviolet excitation blue emission phosphor (B phosphor).

Further, a shell-like sealing portion 109 of silicon resin is so formed as to seal the frame 102 in which the LED 101 is set, the wire 104 and the joint between the wire 104 and the second lead 105. Other ends of the first lead 103 and the second lead 105 are exposed from the sealing portion 109. Thus, the LED lamp 100 of the aforementioned related technique is constituted.

In this LED lamp 100, ultraviolet light emitted from the LED 101 is diffused by the light diffusion portion 106. Thereafter the diffused ultraviolet light is converted to red, green and blue by exciting the RGB phosphors in the phosphor portion 107 respectively. Then, these are so mixed with each other that white light can be implemented.

In the LED lamp 100 according to the aforementioned related technique, however, the diffusion agent consisting of alumina particles or the like is mixed into the silicon resin in a prescribed compounding ratio, and a substance obtained by stirring this is charged into the recess portion of the frame 102 thereby forming the light diffusion portion 106. At this time, it is difficult to homogeneously mix the silicon resin and the diffusion agent with each other, and hence distribution of the diffusion agent in the light diffusion portion 106 easily becomes heterogeneous. Therefore, the most part of the light emitted from the LED 101 may be blocked by the diffusion agent, or the emitted light may be hardly diffused but transmitted. Consequently, the LED lamp 100 according to the aforementioned related technique has such a problem that the light intensity and the color tone easily vary with the direction of observation.

In the LED lamp 100 according to the aforementioned related technique, the thickness of the light diffusion portion 106 or the concentration of the diffusion agent in the light diffusion portion 106 is increased, in order to solve the aforementioned problem. In this case, however, there is such a problem that the ratio of light absorbed by the light diffusion portion 106 is increased following increase in the number of reflection times in the light diffusion portion 106 and hence an outwardly radiated light output is reduced.

DISCLOSURE OF THE INVENTION

The present invention has been proposed in order to solve the aforementioned problems, and an object of the present invention is to provide such a semiconductor light-emitting device that emitted light has small directivity of light intensity and a color tone and a light output is hardly reduced.

In order to attain the aforementioned object, a semiconductor light-emitting device according to a first aspect of the present invention comprises a semiconductor light-emitting element and a thin-film light diffusion portion arranged on a light-emitting direction side of the semiconductor light-emitting element. In this specification, "thin-film light diffusion portion" denotes a light diffusion portion having a small thickness, whose thickness is preferably not more than about 100 nm, dissimilarly to a sheetlike light diffusion portion, having a large thickness, containing a diffusion agent.

In the semiconductor light-emitting device according to the first aspect of the present invention, as hereinabove described, the thin-film light diffusion portion having a small thickness is so provided that optical characteristics such as the transmittance and the refractive index can be uniformized in the light diffusion portion at the wavelength level of the emitted light. Thus, the degree of light diffusion does not vary with the location of the light diffusion portion, but location unevenness of light diffusion can be reduced as compared with the light diffusion portion according to the aforementioned related technique, having the large thickness, containing the diffusion agent. Consequently, the light emitted from the semiconductor light-emitting element can be uniformly diffused regardless of the emitting direction thereof, whereby the directivity of the light intensity and the color tone of the emitted light can be reduced. Further, the thickness of the light diffusion portion can be reduced by employing the thin-film light diffusion portion dissimilarly to the light diffusion portion containing the diffusion agent, whereby the number of times for reflecting the emitted light can be reduced. Thus, reduction of the outwardly radiated light output can be suppressed.

In the aforementioned semiconductor light-emitting device according to the first aspect, the thin-film light diffusion portion preferably includes a plurality of islandlike light diffusion portions. According to this structure, the emitted light is easily outwardly radiated from the space(s) between the respective islands, whereby reduction of the light output can be further suppressed.

In this case, the plurality of islandlike light diffusion portions are preferably arranged substantially over the whole of the surface of a resin layer. According to this structure, the emitted light reaching substantially the overall region of the surface of the resin layer is diffused by the light diffusion portion, whereby the directivity of the light intensity and the color tone of the emitted light can be reliably reduced.

In the aforementioned structure having the light diffusion portion including the plurality of islandlike light diffusion portions, the islandlike light diffusion portions preferably have convex curved surfaces on sides where emitted light reaches. According to this structure, the emitted light reaching the light diffusion portion can be more diffused by the convex curved surfaces as compared with a case of reflecting the same by planar surfaces, whereby the directivity of the light intensity and the color tone of the emitted light can be further reduced.

In the aforementioned structure having the light diffusion portion including the plurality of islandlike light diffusion portions, the light diffusion portion is preferably formed in such a shape that a single layer is separated into a plurality of islands. According to this structure, the number of times in which the emitted light is reflected by the light diffusion portion is reduced as compared with a light diffusion portion formed in a multilayered manner, whereby the ratio of light absorbed in the light diffusion portion can be reduced. Consequently, reduction of the outwardly radiated light output can be suppressed.

In the aforementioned semiconductor light-emitting device according to the first aspect, the light diffusion portion is preferably formed by vapor phase deposition. According to this structure, the interior of the thin-film light diffusion portion is constituted of a homogeneous material, whereby the directivity of the light intensity and the color tone of the emitted light can be further reduced.

In the aforementioned semiconductor light-emitting device according to the first aspect, the light diffusion portion is preferably arranged separately from the semiconductor light-emitting element. According to this structure, a problem as to the directivity of the light in the vicinity of the semiconductor light-emitting element disappears, whereby the light emitted from the semiconductor light-emitting element can be more uniformly diffused.

The aforementioned semiconductor light-emitting device according to the first aspect preferably further comprises a wavelength conversion portion containing a phosphor. According to this structure, the light emitted from the semiconductor light-emitting element is wavelength-converted, whereby light having a different color tone from the light emitted from the semiconductor light-emitting element can be obtained.

In this case, the wavelength conversion portion is preferably formed into a sheet, and the light diffusion portion is preferably formed on the surface or on the back surface of the wavelength conversion portion. According to this structure, the wavelength conversion portion can be easily arranged on the semiconductor light-emitting element, whereby an easily manufacturable semiconductor light-emitting device comprising the wavelength conversion portion can be obtained.

In the aforementioned structure comprising the wavelength conversion portion, the light diffusion portion is preferably provided between the wavelength conversion portion and the semiconductor light-emitting element. According to this structure, the emitted light is diffused by the light diffusion portion before reaching the wavelength conversion portion, whereby the diffused emitted light can be wavelength-converted by the wavelength conversion portion.

In the aforementioned structure comprising the wavelength conversion portion, the light diffusion portion preferably has a thickness smaller than the thickness of the wavelength conversion portion. According to this structure, miniaturization of the semiconductor light-emitting device can be attained due to the reduction in the thickness of the light diffusion portion.

In the aforementioned semiconductor light-emitting device according to the first aspect, the semiconductor light-emitting element is preferably arranged in a mirror-finished frame. According to this structure, the frame easily reflects the emitted light, whereby the ratio of light absorbed by the frame can be reduced. Consequently, reduction of the outwardly radiated light output can be further suppressed.

In the aforementioned semiconductor light-emitting device according to the first aspect, the light diffusion portion preferably includes an aluminum thin film. According to this structure, the thin-film light diffusion portion can be made of aluminum which is easy to manufacture.

In the aforementioned semiconductor light-emitting device according to the first aspect, the light diffusion portion preferably includes a titanium oxide thin film. According to this structure, a thin film made of titanium oxide having larger light transmittance as compared with the aluminum thin film can be employed, whereby reduction of the outwardly radiated light output can be further suppressed.

The aforementioned semiconductor light-emitting device according to the first aspect preferably further comprises a resin layer whose surface is formed in a corrugated shape, and the light diffusion portion is preferably arranged on the surface of the corrugated shape of the resin layer. According to this structure, the islandlike light diffusion portions can be easily formed through the corrugated shape of the surface possessed by the resin layer.

In this case, the light diffusion portion is preferably formed in a plurality of recess portions of the corrugated shape of the resin layer in the form of islands. According to this structure, surfaces of the respective islands of the light diffusion portion in contact with the resin layer are formed along curved shapes of the recess portions of the resin layer, whereby the surfaces of the respective islands of the light diffusion portion in contact with the resin layer can be easily formed in curved shapes. Thus, the emitted light can be easily diffused when the curved surfaces of the respective islands of the light diffusion portion are arranged on a side where the emitted light reaches.

In the aforementioned semiconductor light-emitting device according to the first aspect, the light diffusion portion is preferably formed in a manner convexly bent toward the light-emitting direction to cover the semiconductor light-emitting element. According to this structure, the light emitted from the semiconductor light-emitting element can be diffused in a wider range as compared with a light diffusion portion not convexly bent, whereby the directivity of the light intensity and the color tone of the emitted light can be further reduced.

In the aforementioned semiconductor light-emitting device according to the first aspect, a space may be provided between the light diffusion portion and the semiconductor light-emitting element.

BEST MODES FOR CARRYING OUT THE INVENTION

Embodiments of the present invention are now described with reference to the drawings.

First Embodiment

The structure of an LED lamp 10 according to a first embodiment of the present invention is described with reference to FIGS. 1 to 5. In this first embodiment, a case of applying the present invention to an LED lamp which is an example of a semiconductor light-emitting device is described.

Figure 1:
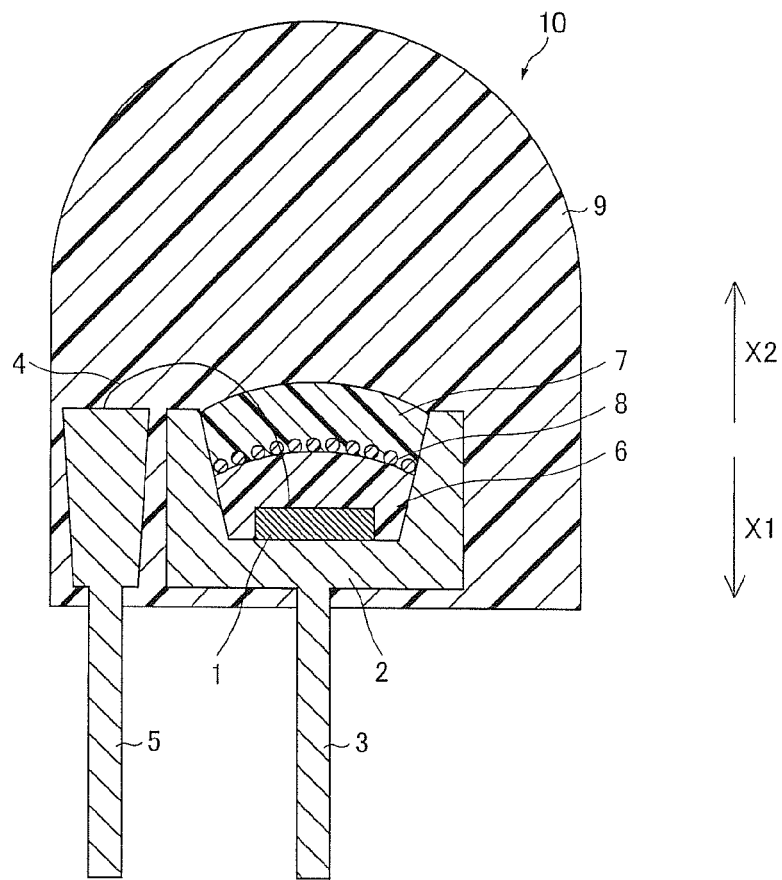
FIG. 1 A sectional view schematically showing the structure of an LED lamp (semiconductor light-emitting device) according to a first embodiment of the present invention.

As shown in FIG. 1, an LED 1 of ultraviolet emission having an emission wavelength peak of about 390 nm to about 410 nm is fixed to the bottom surface of a recess portion of a metal frame 2 with solder or the like (not shown) in the shell-like LED lamp 10 according to the first embodiment of the present invention. Thus, a p-side electrode (not shown) of the LED 1 is electrically connected with the frame 2. The inner surface of the recess portion of the frame 2 is so mirror-finished that light emitted from the LED 1 is easily reflected, and so formed as to function as a light reflecting portion. One end of a first lead 3 is mounted on the frame 2. An n-side electrode (not shown) of the LED 1 is electrically connected with one end of a second lead 5 through a metal wire 4. The LED 1 is an example of the "semiconductor light-emitting element" in the present invention.

A first resin portion 6, covering the LED 1, arranged on the bottom surface side (arrow X1 direction side) and a second resin portion 7 arranged on an arrow X2 direction side of the first resin portion 6 are formed in the recess portion of the frame 2, and both of the first resin portion 6 and the second resin portion 7 are made of silicon resin. The surface of the first resin portion 6 has a fine corrugated shape.

A light diffusion portion 8 consisting of an Al thin film having a thickness of about 3 nm is formed between the first resin portion 6 and the second resin portion 7 by vacuum evaporation. The vacuum evaporation is an example of the "vapor phase deposition" in the present invention. The structure of the light diffusion portion 8 is now described in detail.

Figure 2:
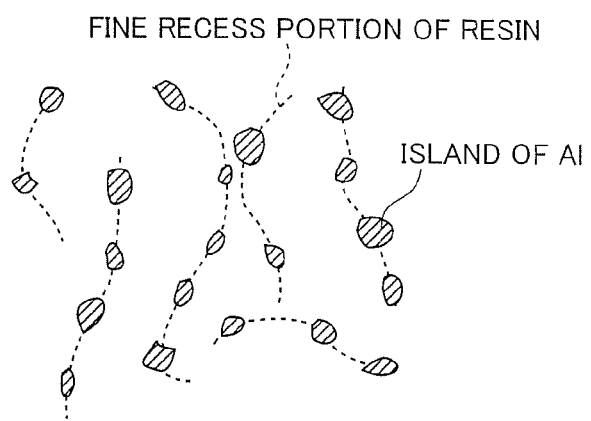
FIG. 2 A conceptual diagram in a case of observing a light diffusion portion, having a thickness of about 3 nm, of the LED lamp shown in FIG. 1 in a planar manner.
Figure 3:
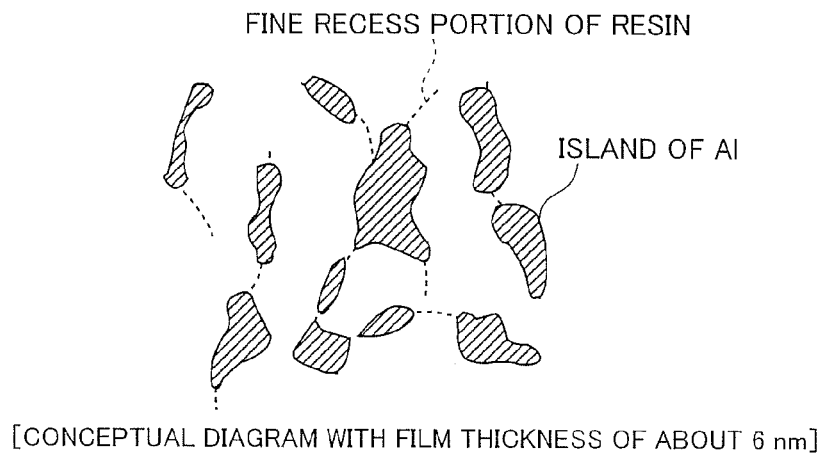
FIG. 3 A conceptual diagram in a case of observing a light diffusion portion having a thickness of about 6 nm in a planar manner.
Figure 4:
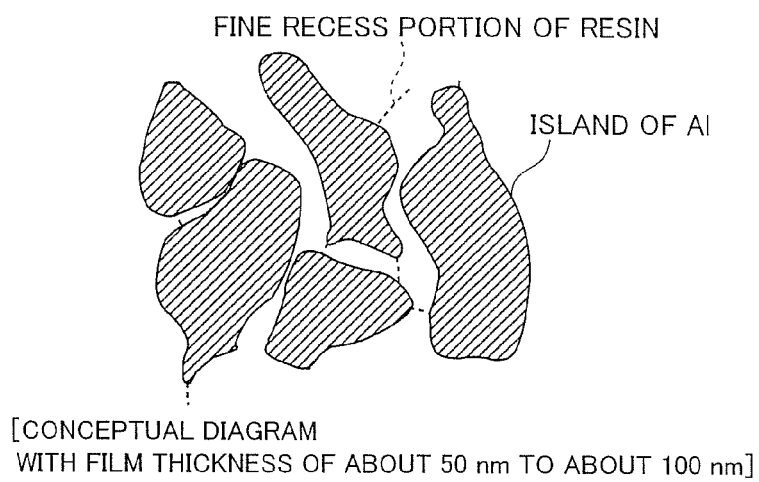
FIG. 4 A conceptual diagram in a case of observing a light diffusion portion having a thickness of about 50 to about 100 nm in a planar manner.

According to the first embodiment, the light diffusion portion 8 is formed over the whole of the surface of the first resin portion 6. The light diffusion portion 8 is formed in a manner convexly bent in a light-emitting direction (arrow X2 direction) to cover the LED 1, along the surface shape of the first resin portion 6. The thickness of the light diffusion portion 8 consisting of the Al thin film is about 3 nm, and rendered smaller than the thicknesses of the first resin portion 6 and the second resin portion 7. As shown in FIGS. 1 and 2, the Al thin film is formed by islands, and not in the form of a continuous film with the thickness of about 3 nm. In other words, the Al thin film having the thickness of about 3 nm is formed in fine recess portions of the first resin portion 6 as a plurality of islands in plan view, as shown in FIG. 2. When the thickness increases (about 6 nm (see FIG. 3) and about 50 nm to about 100 nm (see FIG. 4)) as shown in FIGS. 3 and 4, for example, the respective islands increase in size and the interval between the respective islands reduces, whereby the Al thin film approaches a continuous film.

Figure 5:
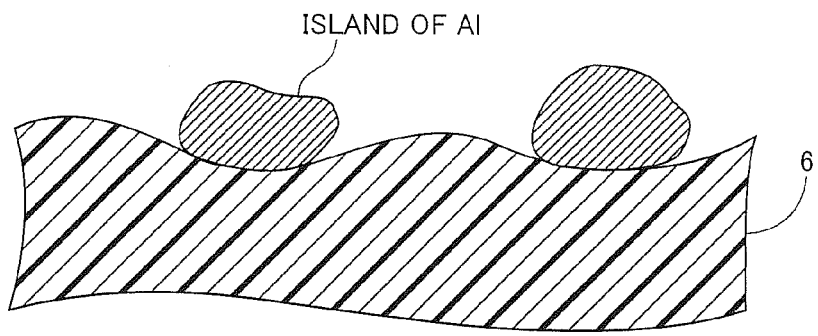
FIG. 5 A conceptual diagram in a case of observing the light diffusion portion, having the thickness of about 3 nm, of the LED lamp shown in FIG. 1 in a sectional manner.

The respective islands of the light diffusion portion 8 are formed in the fine recess portions of the first resin portion 6 as shown in FIG. 5, whereby the bottom sides (sides coming into contact with the first resin portion 6) of the respective islands are formed into curved surfaces along the shapes of the fine recess portions of the first resin portion 6. Thus, emitted light reaching the light diffusion portion 8 through the first resin portion 6 is easily diffused by the curved surfaces of the bottom portions of the respective islands.

A shell-like sealing portion 9 of silicon resin is so formed as to seal the frame 2 including the LED 1, the wire 4 and the joint between the wire 4 and the second lead 5. Other ends of the first lead 3 and the second lead 5 are exposed from the sealing portion 9. Thus, the LED lamp 10 according to the first embodiment of the present invention is constituted.

Figure 6:
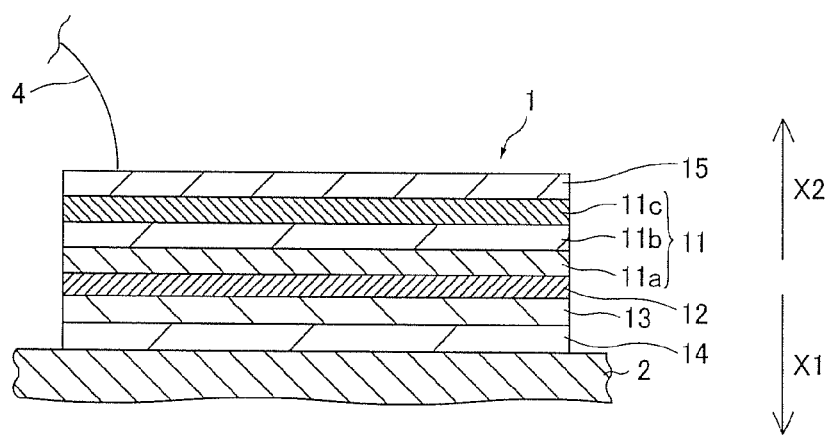
FIG. 6 A sectional view schematically showing the structure of an LED employed for the LED lamp of FIG. 1 and a set state in a frame.

As shown in FIG. 6, the LED 1 comprises a semiconductor element layer 11 in which a p-side layer 11a such as a p-clad layer, an emission layer 11b and an n-side layer 11c such as an n-type clad layer made of GaN-based semiconductor materials respectively are stacked in this order. A first p-side electrode 12 is bonded onto a support substrate 13 of p-type Ge through solder or the like (not shown). A second p-side electrode 14 is formed on the lower surface of the support substrate 13. Further, a translucent n-side electrode 15 is formed on the n-side layer 11c.

The semiconductor element layer 11 is a layer in which the n-side layer 11c, the emission layer 11b and the p-side layer 11a are grown on a growth substrate of GaN in this order. This growth substrate is separated around the interface between the same and the n-side layer 11c after the semiconductor element layer 11 and the support substrate 13 are bonded to each other through the first p-side electrode 12 and solder or the like (not shown).

The support substrate 13 is fixed to the bottom surface of the recess portion of the frame 2 through the second p-side electrode 14 and solder or the like (not shown), and electrically connected therewith. One end of the wire 4 connected with the second lead 5 (see FIG. 1) is bonded onto the n-side electrode 15.

This LED 1 has a structure obtained by re-bonding the GaN-based semiconductor element layer 11 having been temporarily grown on the growth substrate to the support substrate 13 as hereinabove described, and the area on the side surface side is small as compared with the area on the upper surface side of the LED 1. Therefore, the light emitted from this LED 1 mainly has directivity outgoing from the upper surface (n-side electrode 15) side of the LED 1 in a direction (arrow X2 direction) perpendicular to this surface.

According to the first embodiment, as hereinabove described, the light diffusion portion 8 of the Al thin film having the small thickness is so provided that optical characteristics such as the transmittance and the refractive index can be uniformized in the light diffusion portion 8 at the wavelength level of the emitted light. Thus, the degree of light diffusion does not vary with the location of the light diffusion portion 8, but location unevenness of light diffusion can be reduced as compared with a light diffusion portion, having a large thickness, containing a diffusion agent. Consequently, the light emitted from the LED 1 can be uniformly diffused regardless of the emitting direction thereof, whereby the directivity of the light intensity and the color tone of the emitted light can be reduced. When the light diffusion portion 8 is formed by the Al thin film, the emitted light is conceivably diffused mainly by reflection. Further, the thickness of the light diffusion portion 8 can be reduced (about 3 nm) by employing the thin-film light diffusion portion 8 dissimilarly to the light diffusion portion containing the diffusion agent, whereby the number of times for reflecting the emitted light can be reduced. Thus, reduction of an outwardly radiated light output can be suppressed.

According to the first embodiment, the light diffusion portion 8 of the Al thin film is so provided in the form of the plurality of islands that the emitted light is easily outwardly radiated from the spaces between the respective islands, whereby reduction of the light output can be suppressed.

According to the first embodiment, the light diffusion portion 8 consisting of the Al thin film is so formed by vacuum evaporation that the interior of the light diffusion portion 8 is constituted of a homogeneous material, whereby the directivity of the light intensity of the emitted light can be reduced.

According to the first embodiment, the light diffusion portion 8 is so constituted of the Al thin film that light absorption in the light diffusion portion 8 can be suppressed, while reflectance can be increased. Thus, the light emitted from the LED 1 can be uniformly diffused.

According to the first embodiment, the thin-film light diffusion portion 8 is so formed on the surface of the first resin portion 6 on the arrow X2 direction side that the light diffusion portion 8 is arranged separately from the LED 1, whereby a problem as to the directivity of the light in the vicinity of the LED 1 disappears. Consequently, the light emitted from the LED 1 can be uniformly diffused. Further, the inner surface of the recess portion of the frame 2 functions as a light reflecting portion, whereby the light emitted from the LED 1 and diffused light from the light diffusion portion 8 can be efficiently reflected upward (arrow X2 direction).

According to the first embodiment, the LED 1 is so arranged in the recess portion of the mirror-finished frame 2 that the frame 2 easily reflects the emitted light, whereby the ratio of light absorbed by the frame 2 can be reduced. Consequently, reduction of the outwardly radiated light output can be suppressed.

According to the first embodiment, the first resin portion 6 whose surface is formed in the corrugated shape is provided and the light diffusion portion 8 is arranged on the corrugated surface of the first resin portion 6, whereby the islandlike light diffusion portion 8 can be easily formed through the corrugated shape of the surface possessed by the first resin portion 6.

According to the first embodiment, the light diffusion portion 8 is so formed in the manner convexly bent in the light-emitting direction to cover the LED 1 that the light emitted from the LED 1 can be diffused in a wider range as compared with a light diffusion portion not convexly bent, whereby the directivity of the light intensity and the color tone of the emitted light can be further reduced.

Results of evaluation performed as to the effect of the thin-film light diffusion portion 8 in the LED lamp 10 according to the first embodiment are now described. This light output distribution has been obtained by setting the LED lamp 10 in a measuring apparatus and measuring orientation distribution of luminous intensity of the emitted light by Far Field measurement, while setting the direction (arrow X2 direction) perpendicular to the bottom surface of the recess portion of the frame 2 in which the LED 1 is arranged to 90° and setting the direction (direction perpendicular to the arrow X2 direction) parallel to the bottom surface to 0°. Light outputs measured in the respective directions are shown in relative values with reference to the maximum value of the measured values. An LED lamp having a similar structure except that the thin-film light diffusion portion 8 was not formed in the LED lamp 10 according to the first embodiment was prepared as first comparative example, and the light output distribution thereof was evaluated.

Figure 7:
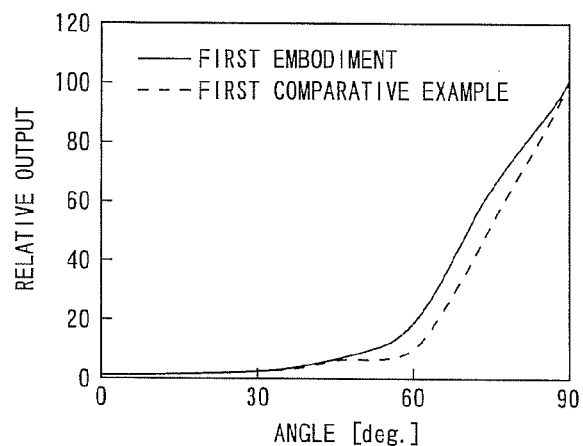
FIG. 7 A characteristic diagram showing light output distribution of the semiconductor light-emitting device according to the first embodiment of the present invention.

Referring to FIG. 7, the solid line shows the light output distribution of the LED lamp 10 according to the first embodiment, and the broken line shows the light output distribution of the LED lamp according to first comparative example. From this, the light emitted from the LED lamp according to first comparative example outgoes mainly in the 90° direction, i.e., in the direction (arrow X2 direction) perpendicular to the bottom surface of the recess portion of the frame 2 which is the arrangement surface of the LED 1, and the directivity of the LED 1 is reflected as such. In the light emitted from the LED lamp 10 according to the first embodiment, on the other hand, the light output in the direction in the range of 0° to 90° increases as compared with first comparative example, and the emitted light spreads in addition to the perpendicular direction (arrow X2 direction). When comparing total light outputs, it was about 11.9 mW in first comparative example while it was substantially equally about 11.1 mW in the first embodiment, and it has been recognized that the light output was hardly reduced by the thin-film light diffusion portion 8.

Second Embodiment

An LED lamp according to a second embodiment of the present invention is so formed that a second resin portion 7 contains a phosphor, dissimilarly to the LED lamp 10 according to the aforementioned first embodiment.

In this second embodiment, RGB phosphors prepared by mixing a blue emission phosphor (B phosphor) containing an Eu-containing oxide, a green emission phosphor (G phosphor) containing a Cu-containing sulfide and a red emission phosphor (R phosphor) containing a sulfoxide in the ratios of B phosphor:G phosphor:R phosphor=about 3:about 2:about 5 are employed as the phosphor contained in the second resin portion 7. The RGB phosphors are homogeneously mixed in a weight ratio of about 20% with respect to silicon resin.

The remaining structure of the second embodiment is similar to that of the aforementioned first embodiment.

According to the second embodiment, as hereinabove described, the RGB phosphors are so contained in the second resin portion 7 that the second resin portion 7 functions as a wavelength conversion portion. Thus, the RGB phosphors in the second resin portion 7 are excited by ultraviolet light emitted from an LED 1, whereby the ultraviolet light emitted from the LED 1 is converted to red, green and blue. These are so mixed with each other that white light can be implemented. At this time, the ultraviolet light emitted from the LED 1 is uniformly diffused by a light diffusion portion 8 of an Al thin film, whereby the RGB phosphors dispersed in the second resin portion 7 can be uniformly excited. Consequently, white light having a uniform color tone can be obtained regardless of the angle of observation.

The remaining effects of the second embodiment are similar to those of the aforementioned first embodiment.

Results of evaluation performed as to the effect of the thin-film light diffusion portion 8 in the LED lamp according to the second embodiment are now described. This angle dependency of color temperatures was measured similarly to the measurement of the light output distribution shown in FIG. 7 except that spectral distribution was measured in place of the light output. Color temperatures in respective directions were calculated from the measured spectral distribution. An LED lamp having a similar structure except that the light diffusion portion 8 of the Al thin film was not formed in the LED lamp according to the second embodiment was prepared as second comparative example, and angle dependency of color temperatures thereof was evaluated.

Figure 8:
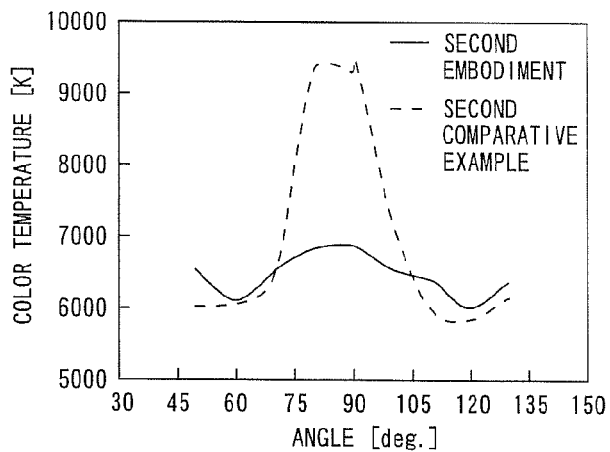
FIG. 8 A characteristic diagram showing angle dependency of color temperatures of an LED lamp according to a second embodiment of the present invention.

Referring to FIG. 8, the solid line shows the color temperature distribution of the LED lamp according to the second embodiment, and the broken line shows the color temperature distribution of the LED lamp according to second comparative example. From this, the color temperature mainly in a 90° direction, i.e., a direction (arrow X2 direction) perpendicular to the bottom surface of a recess portion of a frame 2 which is an arrangement surface of the LED 1 is the largest in the light emitted from the LED lamp according to second comparative example, and difference of at least 3000 K results from the light-emitting directions. Dispersion (standard deviation/average) of the color temperatures was about 0.2534. On the other hand, while the color temperature in the 90° direction (arrow X2 direction) is the largest also in the light emitted from the LED lamp according to the second embodiment, it is smaller by at least 2000 K than the case of second comparative example, and color temperature difference from the other direction is also reduced to not more than 1000 K as a result. Further, dispersion (standard deviation/average) of the color temperatures was also reduced to about 0.1568. In other words, it has been recognized that color heterogeneity was reduced due to the formation of the light diffusion portion 8 of the Al thin film in the LED lamp according to the second embodiment.

Third Embodiment

In an LED lamp 30 according to a third embodiment of the present invention, an LED 31 is arranged on the bottom surface of a recess portion formed in an insulating frame 32, dissimilarly to the LED lamp 10 according to the aforementioned first embodiment. The LED 31 is an example of the "semiconductor light-emitting element" in the present invention.

Figure 9:
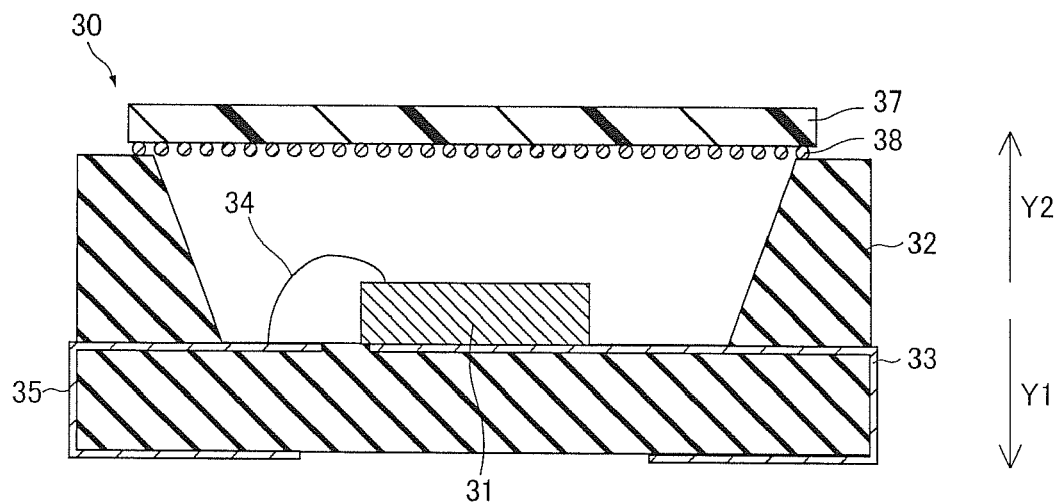
FIG. 9 A sectional view schematically showing the structure of an LED lamp according to a third embodiment of the present invention.

As shown in FIG. 9, the LED 31 of ultraviolet emission having a structure similar to that of the LED 1 according to the aforementioned first embodiment is arranged on the bottom surface of the recess portion formed in the insulating frame 32 in the LED lamp 30 of a surface mounting type according to the third embodiment of the present invention. The inner surface of the recess portion of the frame 32 is so mirror-finished that light emitted from the LED 1 is easily reflected, and so formed as to function as a light reflecting portion. A first lead 33 and a second lead 35 are arranged on the bottom surface of the recess portion of the frame 32, and the LED 31 is fixed onto the first lead 33 on the bottom surface of the recess portion of the frame 32 with solder or the like (not shown). Thus, one electrode (not shown) of the LED 31 is electrically connected to the first lead 33. The first lead 33 and the second lead 35 pass through the frame 32 respectively, to extend to the bottom surface of the frame 32 along the outer edges of the frame 32. Another electrode (not shown) of the LED 31 is electrically connected with the second lead 35 through a metal wire 34.

According to the third embodiment, a phosphor sheet 37 made of silicon resin containing RGB phosphors consisting of a blue emission phosphor, a green emission phosphor and a red emission phosphor similar to that contained in the second resin portion 7 of the aforementioned second embodiment are formed on the recess portion of the frame 32. A light diffusion portion 38 consisting of an Al thin film having a thickness of about 3 nm is formed on the back surface (surface on an arrow Y1 direction side) of the phosphor sheet 37. The Al thin film is formed by islandlike growth similarly to the aforementioned first embodiment, and not in the form of a continuous film. A space is formed between the light diffusion portion 38 and the LED 31. Thus, the LED map 30 according to the third embodiment of the present invention is constituted. The phosphor sheet 37 is an example of the "wavelength conversion portion" in the present invention.

According to the third embodiment, as hereinabove described, the RGB phosphors are so contained in the phosphor sheet 37 that the phosphor sheet 37 functions as a wavelength conversion portion. Thus, the RGB phosphors in the phosphor sheet 37 are excited by ultraviolet light emitted from the LED 31, whereby the ultraviolet light emitted from the LED 31 is converted to red, green and blue. These are so mixed with each other that white light can be implemented. At this time, the ultraviolet light emitted from the LED 31 is uniformly diffused by the light diffusion portion 38 of the Al thin film, whereby the RGB phosphors dispersed in the phosphor sheet 37 can be uniformly excited. Consequently, white light having a uniform color tone can be obtained regardless of the angle of observation.

According to the third embodiment, the phosphor sheet 37 formed into a sheet is so provided as the wavelength conversion portion that the wavelength conversion portion can be easily arranged on the LED 31, whereby an easily manufacturable LED 30 comprising the wavelength conversion portion can be obtained.

According to the third embodiment, the light diffusion portion 38 of the Al thin film is so formed on the back surface (surface on the arrow Y1 direction side) of the phosphor sheet 37 that the light diffusion portion 38 and the LED 31 are separated from each other, whereby a problem as to the directivity of the light in the vicinity of the LED 31 disappears.

Thus, the light emitted from the LED 31 and fluorescence from the phosphor sheet 37 can be uniformly diffused. Further, the inner surface of the recess portion of the frame 32 functions as a light reflecting portion, whereby the light emitted from the LED 31, diffused light from the light diffusion portion 38 and the fluorescence from the phosphor sheet 37 can be efficiently reflected.

The remaining effects of the third embodiment are similar to those of the aforementioned first embodiment.

Results of evaluation performed as to the effect of the light diffusion portion 38 of the Al thin film in the LED lamp 30 according to the third embodiment are now described. In the evaluation, angle dependency of color temperatures was measured as to an LED lamp according to third comparative example comprising a similar structure except that the light diffusion portion 38 of the Al thin film was not formed along with the LED lamp 30 according to the third embodiment, similarly to the LED lamp 20 according to the aforementioned second embodiment. Consequently, dispersion (standard deviation/average) of the color temperatures in the LED lamp according to third comparative example was about 0.1564, while the same was reduced to about 0.1223 in the LED lamp 30 according to the third embodiment. In other words, it has been recognized that color heterogeneity was reduced in the LED lamp 30 according to the third embodiment due to the provision of the light diffusion portion 38 of the Al thin film.

Fourth Embodiment

In an LED lamp 40 according to a fourth embodiment of the present invention, a light diffusion portion 41 is constituted of a titanium oxide thin film having a thickness of about 6 nm, dissimilarly to the LED lamp 30 according to the aforementioned third embodiment. The titanium oxide thin film having the thickness of about 6 nm is formed by vacuum evaporation, and in the form of a continuous film.

Figure 10:
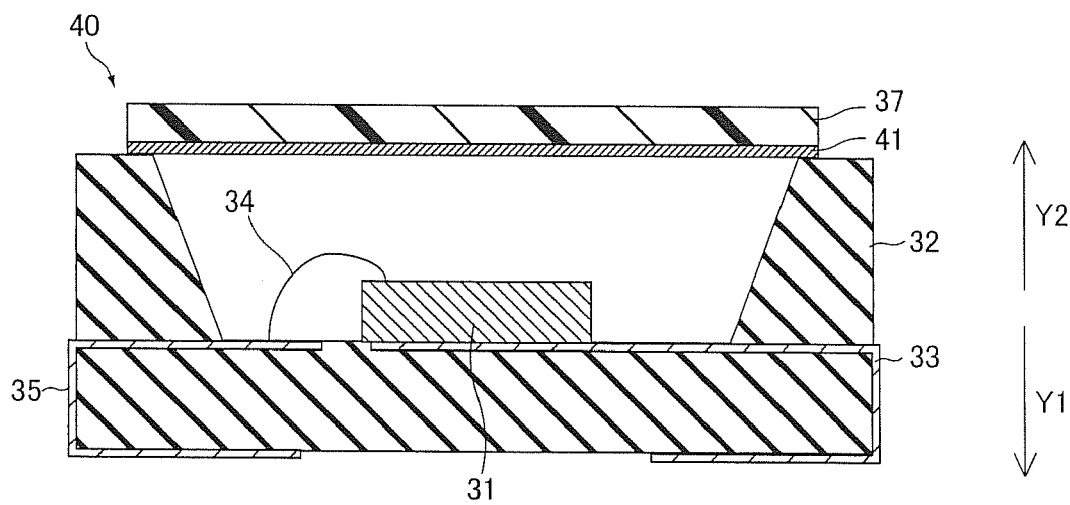
FIG. 10 A sectional view schematically showing the structure of an LED lamp according to a fourth embodiment of the present invention.

According to this fourth embodiment, the thin film made of titanium oxide having larger light transmittance than Al is so employed that the intensity of light extracted from the light diffusion portion 41 can be further increased, as shown in FIG. 10. Further, the light diffusion portion 41 is in the form of a continuous film, whereby the directivity such as the color tone of emitted light can be reduced. When the light diffusion portion 41 is made of titanium oxide, the emitted light is conceivably mainly diffused by refraction.

Also as to the LED lamp 40 according to the fourth embodiment, angle dependency of color temperatures was measured similarly to the LED lamp 30 according to the aforementioned third embodiment. Consequently, it has been recognized that dispersion (standard deviation/average) of the color temperatures in the LED lamp according to a fourth comparative mode was about 0.0604, and color heterogeneity was more reduced than the LED lamp 30 according to the aforementioned third embodiment.

The embodiments disclosed this time are to be considered as illustrative in all points and not restrictive. The range of the present invention is shown not by the above description of the embodiments but by the scope of claim for patent, and all modifications within the meaning and range equivalent to the scope of claim for patent are included.

For example, while the structure of forming the thin-film light diffusion portion between the first resin portion and the second resin portion has been shown in each of the aforementioned first embodiment and the aforementioned second embodiment, the present invention is not restricted to this but the light diffusion portion may alternatively be formed on the arrow X2 direction side (see FIG. 1) of the second resin portion.

Figure 11:
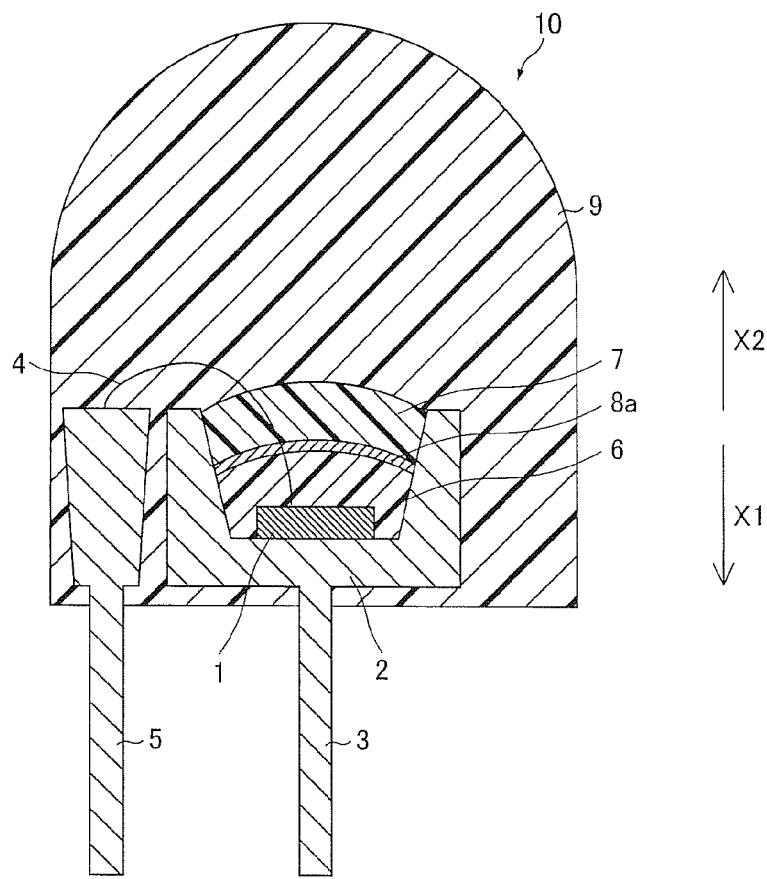
FIG. 11 A sectional view showing a modification of the first embodiment and the second embodiment of the present invention.

While the example of providing the light diffusion portion 8 of the islandlike Al thin film which is not a continuous film has been shown in each of the aforementioned first embodiment and the aforementioned second embodiment, the present invention is not restricted to this but a light diffusion portion 8a of a continuous film such as a titanium oxide film, for example, may alternatively be provided, as shown in FIG. 11.

While the example of providing the first resin portion and the second resin portion containing no phosphors has been shown in the aforementioned first embodiment, the present invention is not restricted to this but a phosphor may be contained in only the first resin portion, or phosphors may be contained in both of the first resin portion and the second resin portion. While the example of containing a phosphor in only the second resin portion has been shown in the aforementioned second embodiment, the present invention is not restricted to this but phosphors may be contained in both of the first resin portion and the second resin portion.

Figure 12:
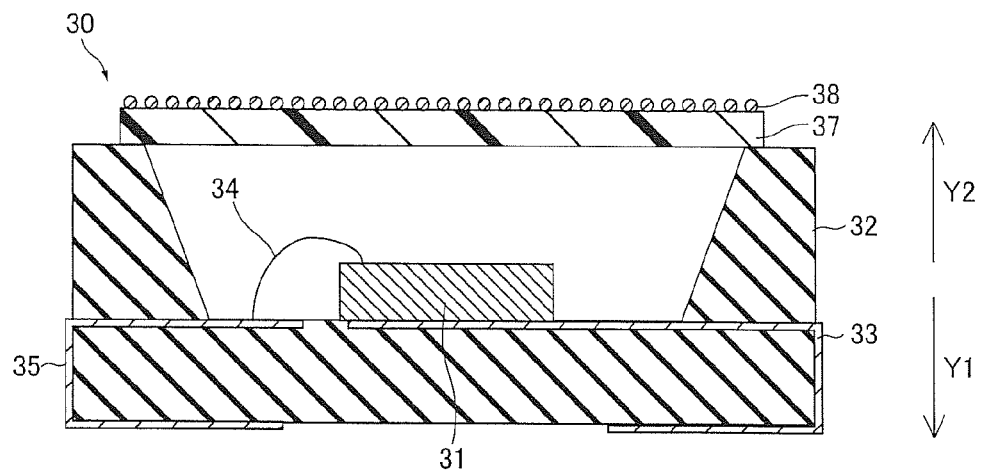
FIG. 12 A sectional showing a modification of the third embodiment of the present invention.
Figure 13:
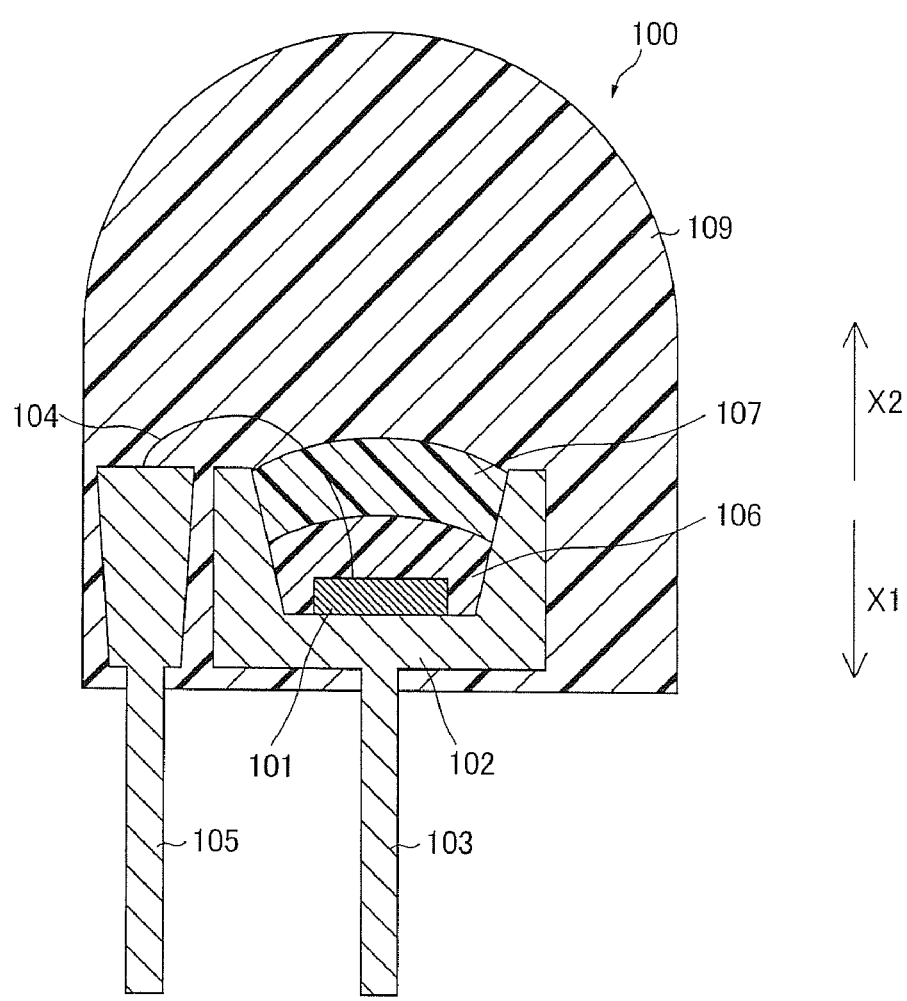
FIG. 13 A sectional view schematically showing the structure of an LED lamp (semiconductor light-emitting device) according to a related technique.

While the structure of forming the light diffusion portion 38 on the back surface (surface on the arrow Y1 direction side) of the phosphor sheet 37, i.e., the surface of the phosphor sheet 37 on the side opposed to the LED 31 has been shown in the aforementioned third embodiment, the present invention is not restricted to this but the light diffusion portion 38 may alternatively be formed on the upper surface (surface on an arrow Y2 direction side) of the phosphor sheet 37, i.e., the surface of the phosphor sheet 37 positioned on the side opposite to the LED 31, as shown in FIG. 12. The light diffusion portion 41 of the aforementioned fourth embodiment may also be formed on the upper surface (surface on the arrow Y2 direction side) of the phosphor sheet 37, similarly to the above.

While the example of providing the phosphor sheet containing the phosphor has been shown in each of the aforementioned third embodiment and the aforementioned fourth embodiment, the present invention is not restricted to this but a resin sheet containing no phosphor may be provided in place of the phosphor sheet.

While the Al thin film or the titanium oxide thin film has been shown as an example of the thin-film light diffusion portion in each of the aforementioned first embodiment to the aforementioned fourth embodiment, the present invention is not restricted to this but thin films made of a metal such as Ti, Cu or Ag and a metal oxide such as aluminum oxide may alternatively be employed for the thin-film light diffusion portion. These thin films may be formed by vapor phase deposition such as sputtering and CVD, in place of the vacuum evaporation. The thickness of the thin-film light diffusion portion, not particularly restricted so far as the light diffusion portion has translucence, is preferably not more than 100 nm, in order to suppress light absorption in the light diffusion portion. Particularly in a case of constituting the thin-film light diffusion portion of the aforementioned metal thin film, the thickness thereof is preferably set to not more than 10 nm.

While the LED of ultraviolet emission has been shown as an example of the semiconductor light-emitting element in each of the aforementioned first embodiment to the aforementioned fourth embodiment, the present invention is not restricted to this but an LED emitting visible light may alternatively be employed as the semiconductor light-emitting element. As to the structure of the LED, an LED of a structure other than the re-bonding type LED may be employed. Also as to the directivity of the light emitted from the LED, an LED having small directivity and performing uniform emission may be employed.

The invention claimed is:

1. A semiconductor light-emitting device comprising:
   a semiconductor light-emitting element;
   a thin-film light diffusion portion arranged on a light-emitting direction side of said semiconductor light-emitting element; and
   a wavelength conversion portion containing a phosphor, wherein
      said wavelength conversion portion is formed into a sheet, and said light diffusion portion is formed only on the upper surface or only on the back surface of said wavelength conversion portion,
      a space is formed between said light diffusion portion and said semiconductor light-emitting element.

2. The semiconductor light-emitting device according to claim 1, wherein
   said thin-film light diffusion portion includes a plurality of islandlike light diffusion portions.

3. A semiconductor light-emitting device comprising:
   a semiconductor light-emitting element;
   a resin portion arranged on a light-emitting direction side of said a semiconductor light-emitting element;
   a wavelength conversion portion containing a phosphor arranged on said light-emitting direction side of said resin portion; and
   a thin-film light diffusion portion arranged only at an interface between said resin portion and said wavelength conversion portion, wherein
      said thin-film light diffusion portion is composed of a plurality of islandlike light diffusion portions.

4. The semiconductor light-emitting device according to claim 3, wherein
   said islandlike light diffusion portions have convex curved surfaces toward said light-emitting direction.

5. The semiconductor light-emitting device according to claim 3, wherein
   said light diffusion portion is formed in such a shape that a single layer is separated into a plurality of islands.

6. The semiconductor light-emitting device according to claim 3, wherein
   said light diffusion portion is formed by vapor phase deposition.

7. The semiconductor light-emitting device according to claim 3, wherein
   said light diffusion portion is arranged separately from said semiconductor light-emitting element.

8. The semiconductor light-emitting device according to claim 3, further comprising a wavelength conversion portion containing a phosphor.

9. The semiconductor light-emitting device according to claim 8, wherein
   said wavelength conversion portion is formed into a sheet, and
   said light diffusion portion is formed on the upper surface or on the back surface of said wavelength conversion portion.

10. The semiconductor light-emitting device according to claim 8, wherein
    said light diffusion portion is provided between said wavelength conversion portion and said semiconductor light-emitting element.

11. The semiconductor light-emitting device according to claim 8, wherein
    said light diffusion portion has a thickness smaller than the thickness of said wavelength conversion portion.

12. The semiconductor light-emitting device according to claim 3, wherein
    said semiconductor light-emitting element is arranged in a mirror-finished frame.

13. The semiconductor light-emitting device according to claim 3, wherein
    said light diffusion portion includes an aluminum thin film.

14. The semiconductor light-emitting device according to claim 3, wherein
    said light diffusion portion includes a titanium oxide thin film.

15. The semiconductor light-emitting device according to claim 3, wherein
    said resin has a surface formed in a corrugated shape, and
    said light diffusion portion is arranged on the surface of said corrugated shape of said resin.

16. The semiconductor light-emitting device according to claim 15, wherein
    said light diffusion portion is formed in a plurality of recess portions of said corrugated shape of said resin in the form of islands.

17. The semiconductor light-emitting device according to claim 3, wherein
    said light diffusion portion is formed in a manner convexly bent toward said light-emitting direction to cover said semiconductor light-emitting element.

18. The semiconductor light-emitting device according to claim 3, having a space between said light diffusion portion and said semiconductor light-emitting element.

* * * * *

UNITED STATES PATENT AND TRADEMARK OFFICE
CERTIFICATE OF CORRECTION

PATENT NO. : 8,384,101 B2
APPLICATION NO. : 12/441247
DATED : February 26, 2013
INVENTOR(S) : Seiichi Tokunaga Page 1 of 1

It is certified that error appears in the above-identified patent and that said Letters Patent is hereby corrected as shown below:

On the Title Page, item [73] should read:

FUTURE LIGHT, LLC

Signed and Sealed this
Seventh Day of January, 2014

Margaret A. Focarino
*Commissioner for Patents of the United States Patent and Trademark Office*